(12) United States Patent
Liu et al.

(10) Patent No.: US 7,868,375 B2
(45) Date of Patent: Jan. 11, 2011

(54) SPLIT GATE NON-VOLATILE FLASH MEMORY CELL HAVING A FLOATING GATE, CONTROL GATE, SELECT GATE AND AN ERASE GATE WITH AN OVERHANG OVER THE FLOATING GATE, ARRAY AND METHOD OF MANUFACTURING

(75) Inventors: Xian Liu, Sunnyvale, CA (US); Amitay Levi, Cupertino, CA (US); Alexander Kotov, Sunnyvale, CA (US); Yuri Tkachev, Sunnyvale, CA (US); Viktor Markov, Sunnnyvale, CA (US); James Yingbo Jia, Fremont, CA (US); Chien Sheng Su, Saratoga, CA (US); Yaw Wen Hu, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/618,632

(22) Filed: Nov. 13, 2009

(65) Prior Publication Data
US 2010/0054043 A1 Mar. 4, 2010

Related U.S. Application Data

(63) Continuation of application No. 11/834,574, filed on Aug. 6, 2007, now abandoned.

(51) Int. Cl.
*H01L 29/788* (2006.01)

(52) U.S. Cl. .............................. 257/320; 257/E29.129
(58) Field of Classification Search ............ 365/185.29; 438/257; 257/317, 319, 320, 321, E21.409, 257/E29.129, E29.304, E29.305
See application file for complete search history.

(56) References Cited

U.S. PATENT DOCUMENTS

| | | | | |
|---|---|---|---|---|
| 5,242,848 A | * | 9/1993 | Yeh ............................. | 438/266 |
| 5,268,319 A | * | 12/1993 | Harari ........................ | 438/260 |
| 6,747,310 B2 | * | 6/2004 | Fan et al. .................... | 257/320 |
| 6,992,929 B2 | * | 1/2006 | Chen et al. ............. | 365/185.17 |

\* cited by examiner

*Primary Examiner*—Minh-Loan T Tran
*Assistant Examiner*—Vongsavanh Sengdara
(74) *Attorney, Agent, or Firm*—DLA Piper LLP (US)

(57) ABSTRACT

An improved split gate non-volatile memory cell is made in a substantially single crystalline substrate of a first conductivity type, having a first region of a second conductivity type, a second region of the second conductivity type, with a channel region between the first region and the second region in the substrate. The cell has a select gate above a portion of the channel region, a floating gate over another portion of the channel region, a control gate above the floating gate and an erase gate adjacent to the floating gate. The erase gate has an overhang extending over the floating gate. The ratio of the dimension of the overhang to the dimension of the vertical separation between the floating gate and the erase gate is between approximately 1.0 and 2.5, which improves erase efficiency.

2 Claims, 14 Drawing Sheets

US 7,868,375 B2

SPLIT GATE NON-VOLATILE FLASH MEMORY CELL HAVING A FLOATING GATE, CONTROL GATE, SELECT GATE AND AN ERASE GATE WITH AN OVERHANG OVER THE FLOATING GATE, ARRAY AND METHOD OF MANUFACTURING

CROSS REFERENCE TO RELATED APPLICATIONS

This application is a continuation of U.S. application Ser. No. 11/834,574, filed Aug. 6, 2007, the entire contents of which is incorporated herein by reference.

TECHNICAL FIELD

The present invention relates to a non-volatile flash memory cell which has a select gate, a floating gate, a control gate, and an erase gate having an overhang with the floating gate in a certain dimensional ratio. The present invention also relates to an array of such flash memory cells, and methods of manufacturing such cell and array.

BACKGROUND OF THE INVENTION

Split gate non-volatile flash memory cells having a select gate, a floating gate, a control gate and an erase gate are well known in the art. See for example U.S. Pat. No. 6,747,310. An erase gate having an overhang over the floating gate is also well know in the art. See for example, U.S. Pat. No. 5,242,848. Both of the foregoing disclosures are incorporated herein by reference in their entirety.

Heretofore, the prior art has failed to teach or disclose that an overhang of the erase gate to the floating gate within certain limitations enhances the erase efficiency.

Accordingly, it is one of the objectives of the present invention to improve the erase efficiency of such a cell by certain dimensional relationship between the erase gate and the floating gate.

SUMMARY OF THE INVENTION

In the present invention, a split gate non-volatile memory cell is made in a substantially single crystalline substrate of a first conductivity type, having a first region of a second conductivity type, a second region of the second conductivity type, with a channel region between the first region and the second region in the substrate. The cell has a select gate insulated and spaced apart from a first portion of the channel region. The cell further has a floating gate insulated and spaced apart from a second portion of the channel region. The floating gate has a first end closest to the select gate and a second end furthest away from the select gate. An erase gate is insulated and spaced apart from the substrate and is closest to the second end of the floating gate. A control gate is insulated and spaced apart from the floating gate, the select gate and the erase gate and is positioned above the floating gate and is between the erase gate and the select gate. The erase gate further has two electrically connected portions: a first portion laterally adjacent to and insulated from the second end of the floating gate and a second portion overlying and insulated from the floating gate and is adjacent to the control gate. The second portion of the erase gate is separated from the floating gate by a first length measured in a direction substantially perpendicular to the direction from the first region to the second region. The second portion of the erase gate has an end closest to the control gate, and the first portion of the erase gate has an end closest to the floating gate. The second portion of the erase gate overlies the floating gate by a second length measured from the end of the second portion of the erase gate closest to the control gate to the end of the first portion of the erase gate closest to the floating gate in a direction substantially perpendicular to the first length direction. Finally, the ratio of the second length to the first length is between approximately 1.0 and 2.5.

The present invention also relates to an array of the foregoing memory cells.

DETAILED DESCRIPTION OF THE INVENTION

Figure 1A:
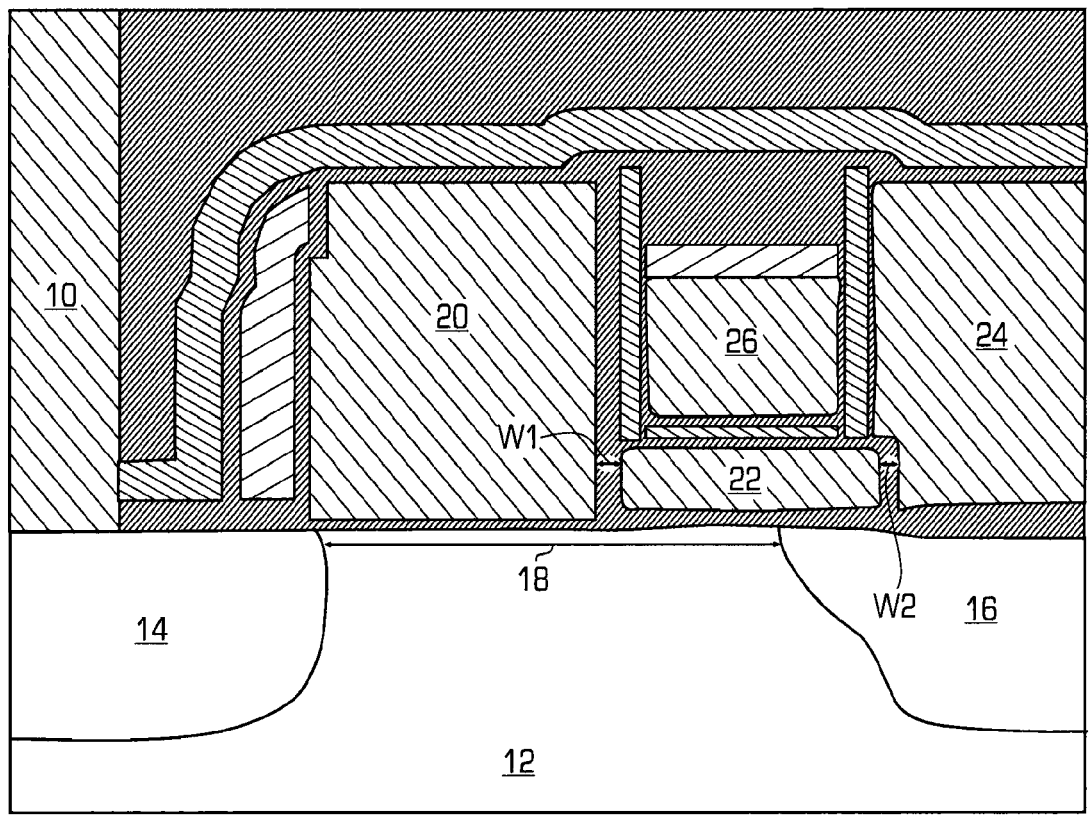
FIG. 1A is a cross sectional view of an improved non-volatile memory cell of the present invention.

Referring to FIG. 1A there is shown a cross-sectional view of an improved non-volatile memory cell 10 of the present invention. The memory cell 10 is made in a substantially single crystalline substrate 12, such as single crystalline silicon, which is of P conductivity type. Within the substrate 12 is a first region 14 of a second conductivity type. If the first conductivity type is P then the second conductivity type is N. Spaced apart from the first region is a second region 16 of the second conductivity type. Between the first region 14 and the second region 16 is a channel region 18, which provides for the conduction of charges between the first region 14 and the second region 16.

Positioned above, and spaced apart and insulated from the substrate 12 is a select gate 20, also known as the word line 20. The select gate 20 is positioned over a first portion of the channel region 18. The first portion of the channel region 18, immediately abuts the first region 14. Thus, the select gate 20 has little or no overlap with the first region 14. A floating gate 22 is also positioned above and is spaced apart and is insulated from the substrate 12. The floating gate 22 is positioned over a second portion of the channel region 18 and a portion of the second region 16. The second portion of the channel region 18 is different from the first portion of the channel region 18. Thus, the floating gate 22 is laterally spaced apart and is insulated from and is adjacent to the select gate 20. An erase gate 24 is positioned over and spaced apart from the second region 16, and is insulated from the substrate 12. The erase gate 24 is laterally insulated and spaced apart from the floating gate 22. The select gate 20 is to one side of the floating gate 22, with the erase gate 24 to another side of the floating gate 22. Finally, positioned above the floating gate 22 and insulated and spaced apart therefrom is a control gate 26. The control gate 26 is insulated and spaced apart from the erase gate 24 and the select gate 20 and is positioned between the erase gate 24 and the select gate 20. Thus far, the foregoing description of the memory cell 10 is disclosed in U.S. Pat. No. 6,747,310.

Figure 1B:
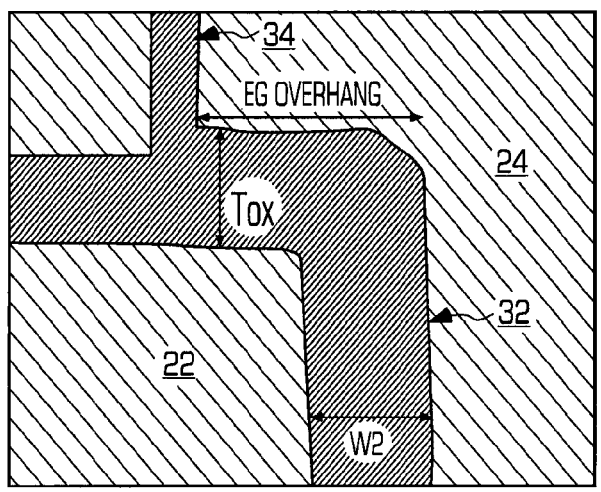
FIG. 1B is an enlarged view of a portion of the cell shown in FIG. 1A, wherein the dimensional relationship between the overhang of the erase gate to the floating gate is shown in greater detail.

In the improvement of the present invention, the erase gate 24 has a portion that overhangs the floating gate 22. This is shown in greater detail in FIG. 1B. The erase gate 24 comprises of two parts that are electrically connected. In the preferred embodiment, the two parts form a monolithic structure, although it is within the present invention that the two parts can be separate parts and electrically connected. A first part of the erase gate 24 is immediately laterally adjacent to the floating gate 22 and is above the second region 16. The first part of the erase gate 24 has an end 32 that is closest to the floating gate 22. The second part of the erase gate 24 is laterally adjacent to the control gate 26 and overhangs a portion of the floating gate 22. The second part of the erase gate has an end 34 that is closest to the control gate 26. The horizontal distance (as measured in the direction between the first region 14 and the second region 16) between the end 34 and the end 32 is called "EG Overhang" as shown in FIG. 1B. The second part of the erase gate 24 which is laterally adjacent to the control gate 26 and overhangs the floating gate 22 is also vertically spaced apart from the floating gate 22. The vertical distance between the floating gate 22 and the second part of the erase gate 24, as measured in the "vertical" direction is called "Tox" as shown in FIG. 1B. The vertical distance of "Tox" is measured in a direction that is substantially perpendicular to the horizontal distance "EG Overhang".

Figure 2:
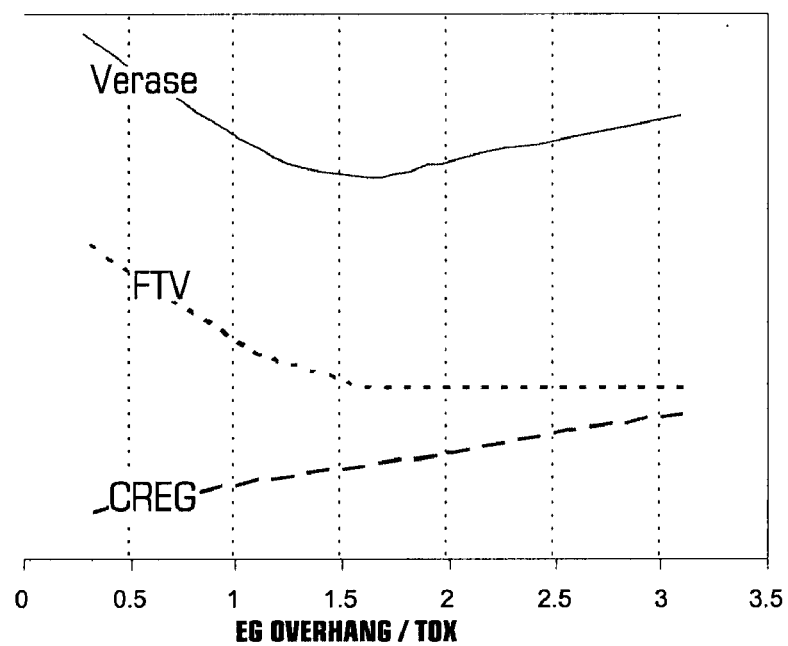
FIG. 2 is a graph showing the improvement to erase efficiency by the improved cell of the present invention.

As described in U.S. Pat. No. 6,747,310, the memory cell 10 erases by electrons tunneling through the Fowler-Nordheim mechanism, from the floating gate 22 to the erase gate. Further, to improve the erase mechanism, the floating gate 22 may have a sharp corner closest to the erase gate 24 to enhance the local electrical field during erase and in turn enhance the flow of electrons from the corner of the floating gate 22 to the erase gate 24. It has been found that erase efficiency is enhanced when the ratio of "EG Overhang" to "Tox" is between approximately 1.0 and 2.5. This is shown in FIG. 2. Referring to FIG. 2, there is shown a graph 30 of FTV, CR, and Verase as functions of the ratio of "EG overhang"/"Tox". Verase is the voltage applied to the erase gate 24 during the erase operation, which can sufficiently erase the cell to "1" state. Verase=(FTV+$Q_{FG}$/$C_{total}$)/(1−CR). $C_{total}$ is the total capacitance between the floating gate 22 and all surrounding nodes. CR is the coupling ratio between the erase gate 24 and the floating gate 22. CR=$C_{EG\text{-}FG}$/$C_{total}$, where $C_{EG\text{-}FG}$ is the capacitance between the erase gate 24 and the floating gate 22. $Q_{FG}$ is the net charge on the floating gate which corresponds to "1" state. FTV is the voltage difference between the erase gate 24 and the floating gate 22 required to erase the cell to "1" state. When "EG overhang" is significantly smaller than "Tox", the electron tunneling barrier in the tunnel oxide adjacent to the corner of floating gate 22 is electrically exposed to the lower potential of the nearby coupling gate 26, resulting in an increase of FTV, and in turn an increase of Verase. When "EG overhang" is significantly larger than "Tox", CR is increased, which also in turn increases Verase. As shown in FIG. 2, the graph 30 shows a minimum of Verase when "EG Overhang"/"Tox" is at approximately 1.6. With Verase requirement reduced, the requirement on the charge pump is similarly reduced. Thus, erase efficiency is enhanced.

There are two embodiments of the memory cell 10 of the present invention. The select gate 20 of the memory cell 10 is separated from the floating gate by an insulating region W1. In the first embodiment of the memory cell 10, the region W1 is silicon dioxide. This is called the cell 10 option A. In the second embodiment of the memory cell 10, the region W1 is a composite layer comprising silicon dioxide, silicon nitride, and silicon dioxide, and this embodiment is called the cell 10 option B.

Referring to FIGS. 3(A-L) there is shown cross-sectional views of the steps in the process to make a cell 10 option A of the present invention. Commencing with FIG. 3A, there is shown the formation of a layer of silicon dioxide 40 on the substrate 12 of P type single crystalline silicon. For the 90 nm (or 120 nm) process, the layer 40 of silicon dioxide is on the order of 80-100 angstroms. Thereafter a first layer 42 of polysilicon (or amorphous silicon) is deposited or formed on the layer 40 of silicon dioxide. Again for purpose of explanation for the 90 nm process, the first layer 42 of polysilicon is on the order of 300-800 angstroms. The first layer 42 of polysilicon is subsequently patterned in a direction perpendicular to the select gate 20.

Figure 3A:
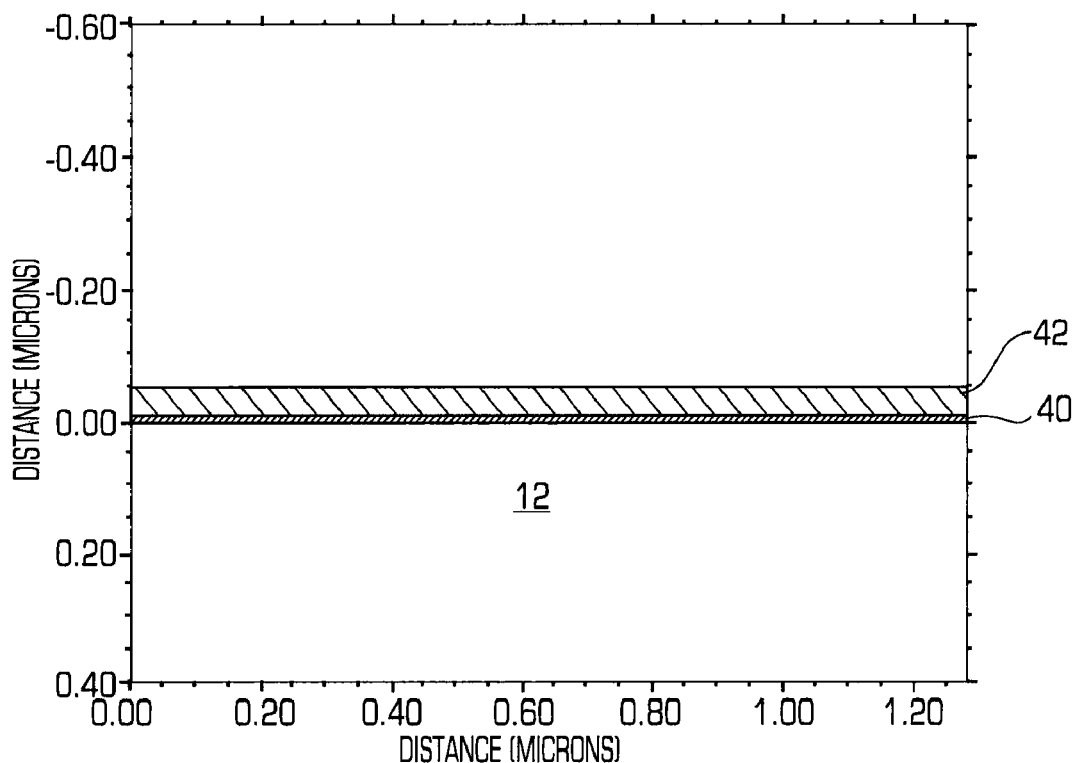
FIGS. 3(A-L) are cross sectional views of one process to make one embodiment the memory cell of the present invention.
Figure 3B:
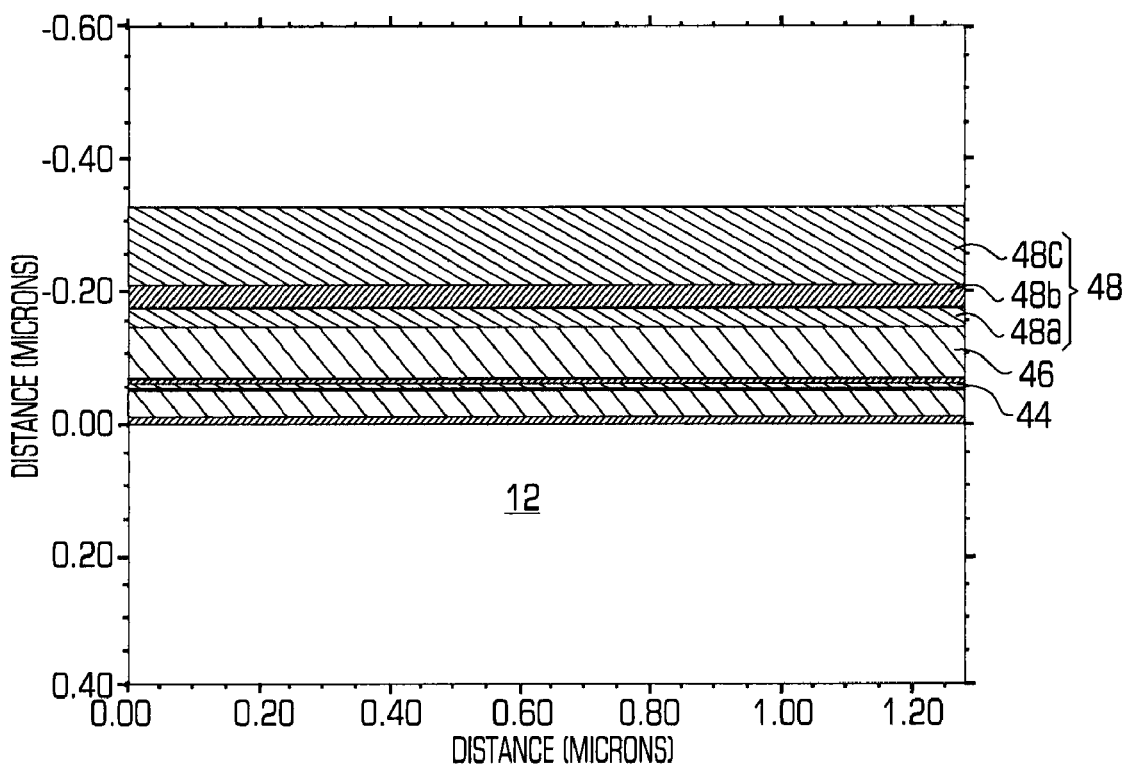

Referring to FIG. 3B there is shown a cross sectional view of the next steps in the process of making the cell 10 option A of the present invention. Another insulating layer 44, such as silicon dioxide (or even a composite layer, such as ONO) is deposited or formed on the first layer 42 of polysilicon. Depending on whether the material is silicon dioxide or ONO, the layer 44 can be on the order of 100-200 angstroms. A second layer 46 of polysilicon is then deposited or formed on the layer 44. The second layer 46 of polysilicon is on the order of 500-4000 angstroms thick. Another layer 48 of insulator is deposited or formed on the second layer 46 of polysilicon and used as a hard mask during subsequent dry etching. In the preferred embodiment, the layer 48 is a composite layer, comprising silicon nitride 48a, silicon dioxide 48b, and silicon nitride 48c. In the preferred embodiment for the 90 nm process, the dimensions are 200-600 angstroms for layer 48a, 200-600 angstroms for layer 48b, and 500-3000 angstroms for layer 48c.

Figure 3C:
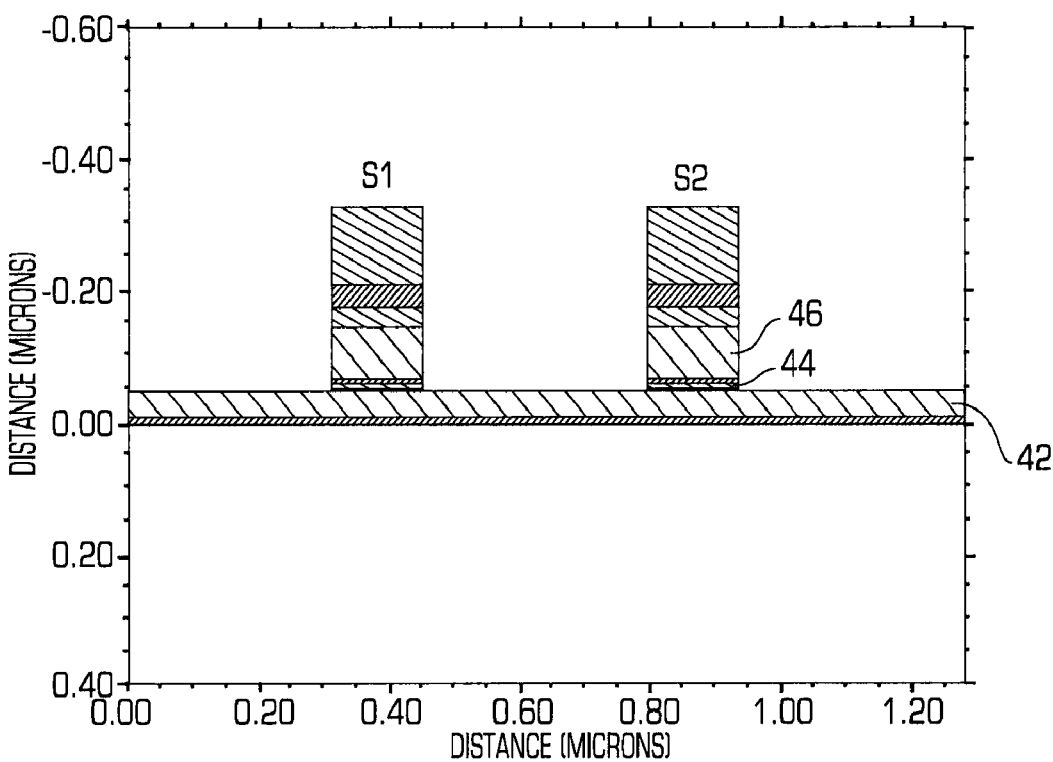

Referring to FIG. 3C there is shown a cross sectional view of the next step in the process of making the cell 10 option A of the present invention. Photoresist material (not shown) is deposited on the structure shown in FIG. 3B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 3C. Although only two "stacks": S1 and S2 are shown, it should be clear that there are number of such "stacks" that are separated from one another.

Figure 3D:
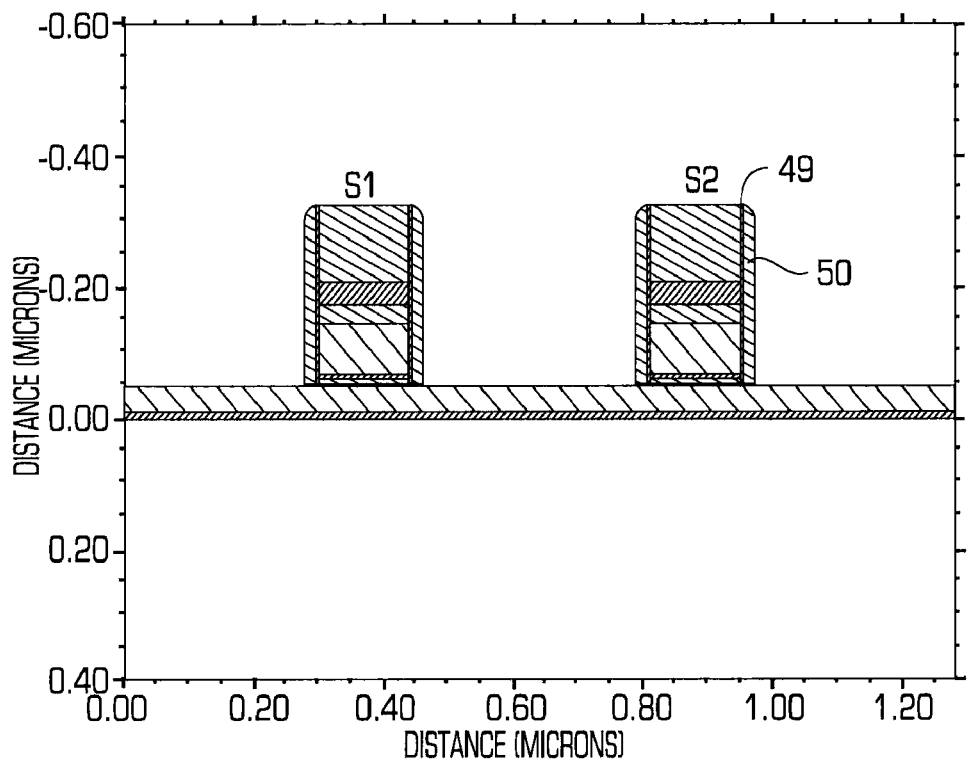

Referring to FIG. 3D there is shown a cross sectional view of the next steps in the process of making the cell 10 option A of the present invention. Silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 3D.

Figure 3E:
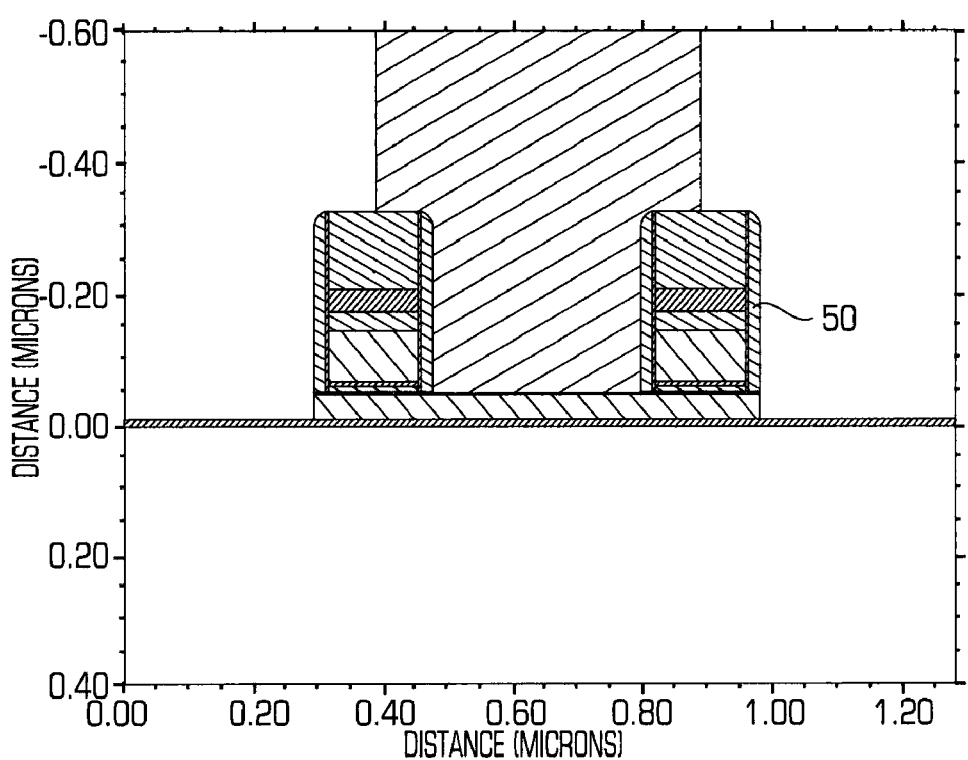

Referring to FIG. 3E there is shown a cross sectional view of the next steps in the process of making the cell 10 option A of the present invention. A photoresist mask is formed over the regions between the stacks S1 and S2, and other alternating pairs stacks. For the purpose of this discussion, this region between the stacks S1 and S2 will be called the "inner region" and the regions not covered by the photoresist, shall be referred to as the "outer regions". The exposed first polysilicon 42 in the outer regions is anisotropically etched. The oxide layer 40 is similarly anisotropically etched. The resultant structure is shown in FIG. 3E.

Figure 3F:
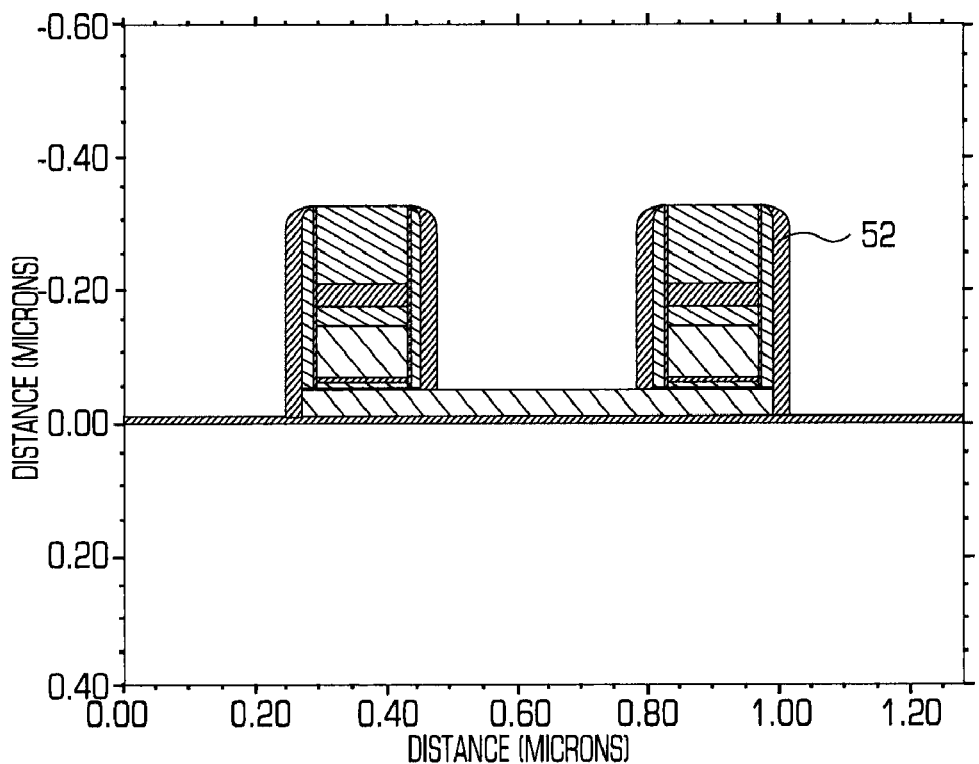

Referring to FIG. 3F there is shown a cross sectional view of the next steps in the process of making the cell 10 option A of the present invention. The photoresist material is removed from the structure shown in FIG. 3E. A layer of oxide 52 is then deposited or formed. The oxide layer 52 is then subject to an anisotropical etch leaving spacers 52, adjacent to the stacks S1 and S2. The resultant structure is shown in FIG. 3F.

Figure 3G:
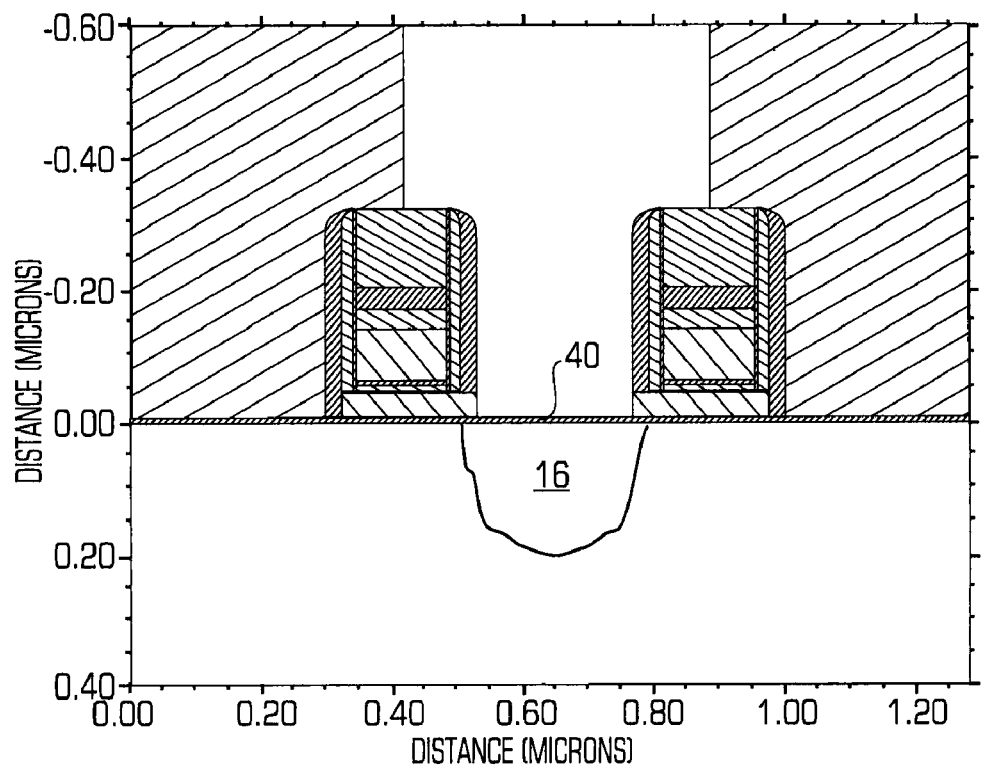

Referring to FIG. 3G there is shown a cross sectional view of the next steps in the process of making the cell 10 option A of the present invention. Photoresist material is then deposited and is masked leaving openings in the inner regions between the stacks S1 and S2. Again, similar to the drawing shown in FIG. 3E, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to a high voltage ion implant forming the second regions 16. The resultant structure is shown in FIG. 3G.

Figure 3H:
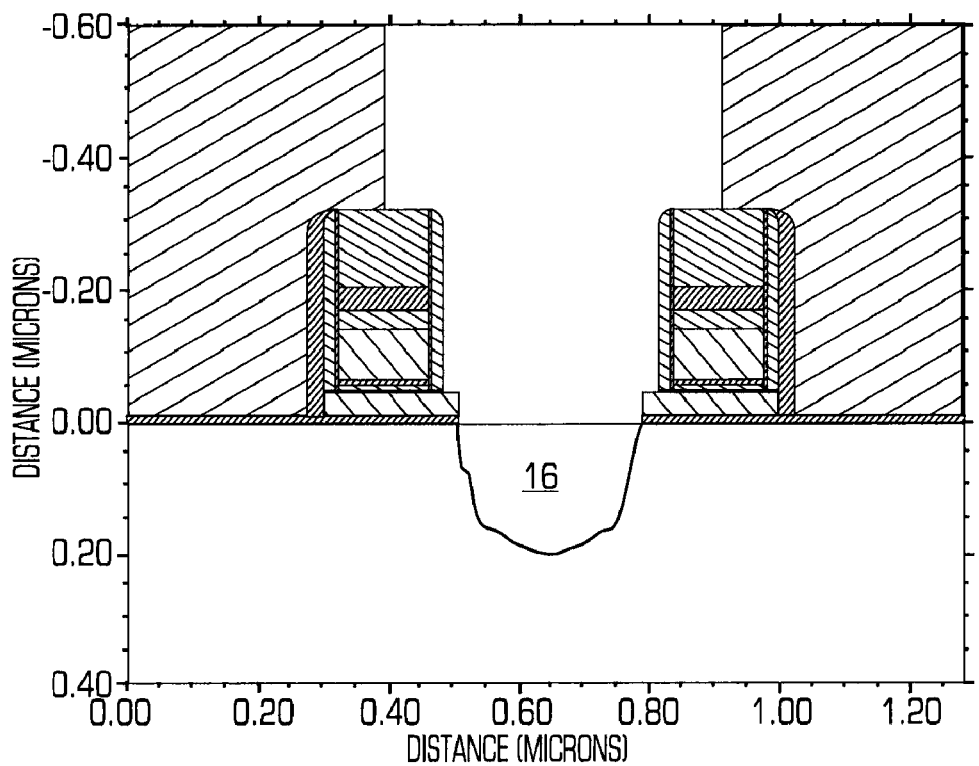

Referring to FIG. 3H there is shown a cross sectional view of the next steps in the process of making the cell 10 option A of the present invention. The oxide spacer 52 adjacent to the stacks S1 and S2 in the inner region is removed by e.g. a wet etch or a dry isotropic etch. The resultant structure is shown in FIG. 3H.

Figure 3I:
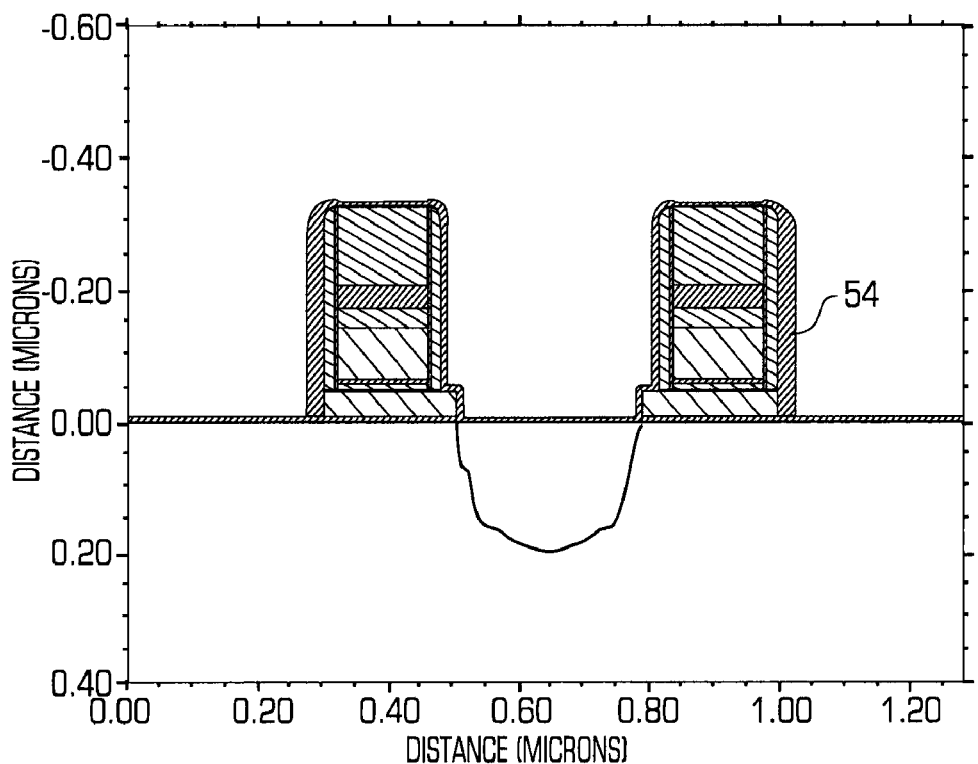

Referring to FIG. 3I there is shown a cross sectional view of the next steps in the process of making the cell 10 option A of the present invention. The photoresist material in the outer regions of the stacks S1 and S2 is removed. Silicon dioxide 54 is deposited or formed everywhere. The resultant structure is shown in FIG. 3I.

Figure 3J:
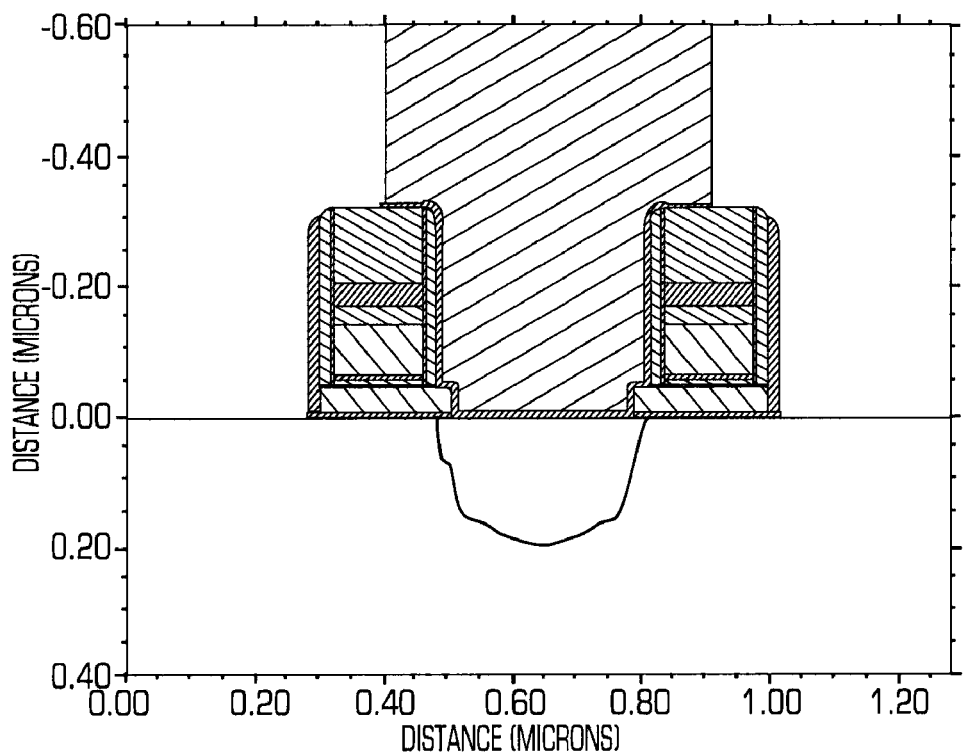

Referring to FIG. 3J there is shown a cross sectional view of the next steps in the process of making the cell 10 option A of the present invention. The structure is once again covered by photoresist material and a masking step is performed exposing the outer regions of the stacks S1 and S2 and leaving photoresist material covering the inner region between the stacks S1 and S2. An oxide anisotropical etch is performed, to reduce the thickness of the spacer 54 in the outer regions of the stack S1 and S2, and to completely remove silicon dioxide from the exposed silicon substrate 12 in the outer regions. The resultant structure is shown in FIG. 3J.

Figure 3K:
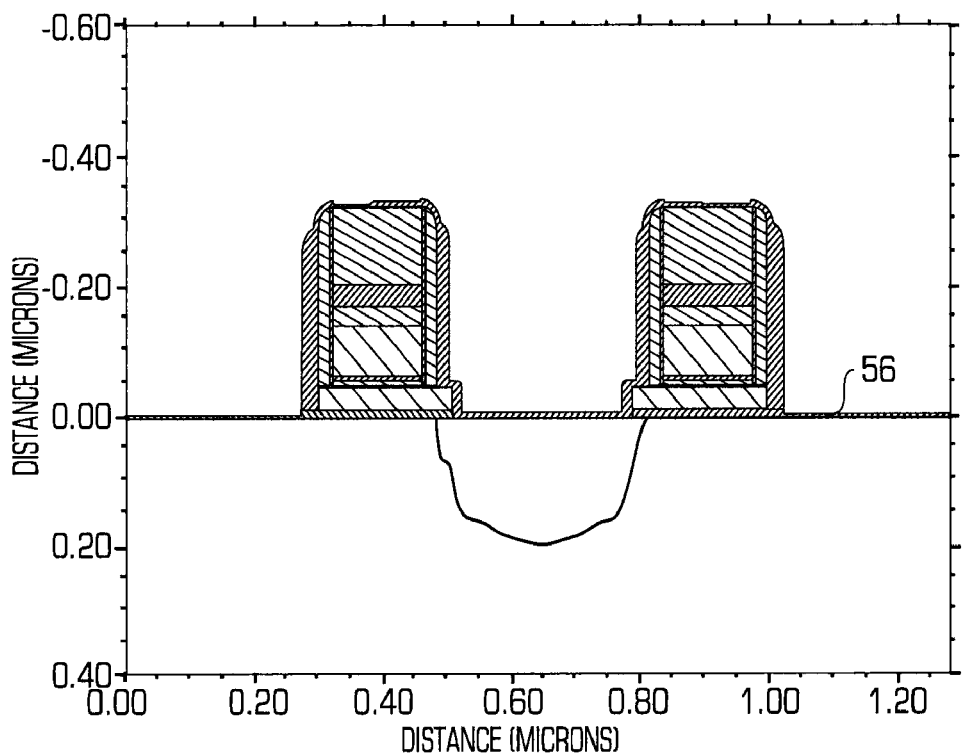

Referring to FIG. 3K there is shown a cross sectional view of the next steps in the process of making the cell 10 option A of the present invention. A thin layer 56 of silicon dioxide, on the order of 20-100 angstroms, is formed on the structure. This oxide layer 56 is the gate oxide between the select gate and the substrate 12. the resultant structure is shown in FIG. 3K.

Figure 3L:
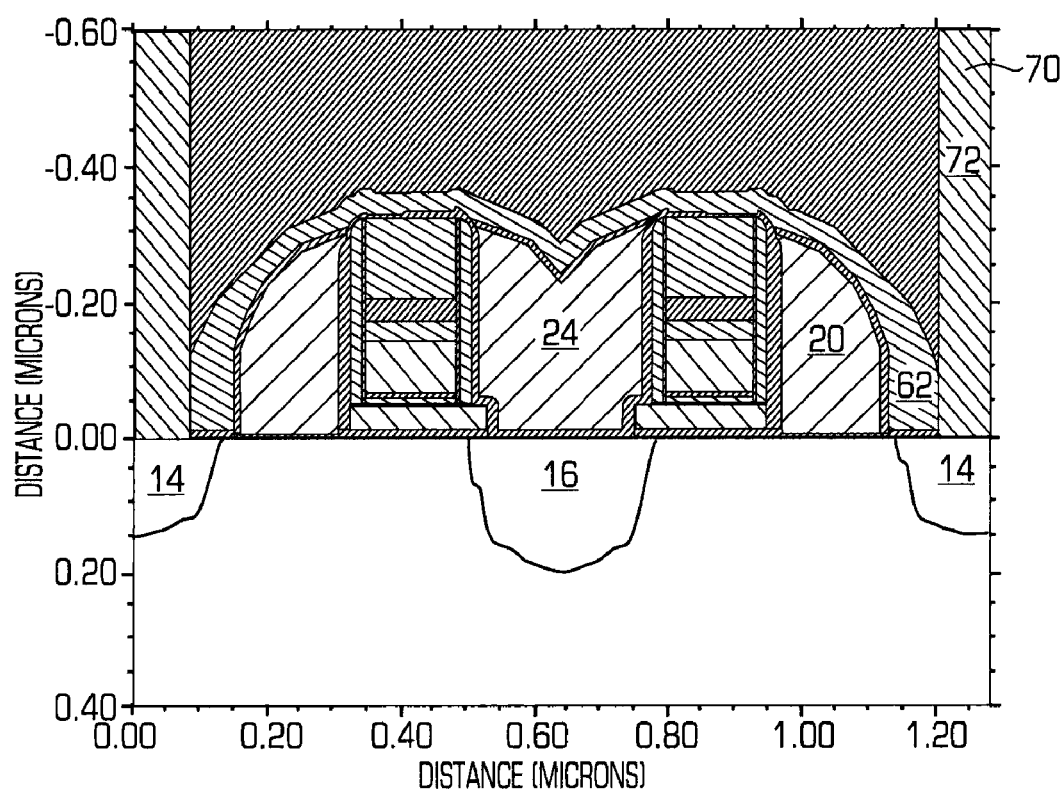

Referring to FIG. 3L there is shown a cross sectional view of the next steps in the process of making the cell 10 option A of the present invention. Polysilicon 60 is deposited everywhere. The layer 60 of polysilicon is then subject to an anisotropical etch forming spacers in the outer regions of the stack S1 and S2 which form the select gates 20 of two memory cells 10 adjacent to one another sharing a common second region 16. In addition, the spacers within the inner regions of the stacks S1 and S2 are merged together forming a single erase gate 24 which is shared by the two adjacent memory cells 10. A layer of insulator 62 is deposited on the structure, and etched anisotropically to form spacers 62 next to the select gates 20. In the preferred embodiment, insulator 62 is a composite layer comprising silicon dioxide and silicon nitride. Thereafter, an ion implant step is performed forming the first regions 14. Each of these memory cells on another side share a common first region 14. Insulators and metallization layers are subsequently deposited and patterned to form bit line 70 and bit line contacts 72.

Referring to FIGS. 4(A-L) there is shown cross-sectional views of the steps in the process to make a cell 10 option B of the present invention. The steps and the description set forth hereinafter are similar to the steps and description above for the method of forming the memory cells 10 option A shown and described in FIGS. 3(A-L). Thus, the same numbers will be used for the same parts. Commencing with FIG. 4A, there is shown the formation of a layer of silicon dioxide 40 on the substrate 12 of P type single crystalline silicon. For the 90 nm process, the layer 40 of silicon dioxide is on the order of 80-100 angstroms. Thereafter a first layer 42 of polysilicon (or amorphous silicon) is deposited or formed on the layer 40 of silicon dioxide. Again for purpose of explanation for the 90 nm process, the first layer 42 of polysilicon is on the order of 300-800 angstroms. The first layer 42 of polysilicon is subsequently patterned in a direction perpendicular to the select gate 20.

Figure 4A:
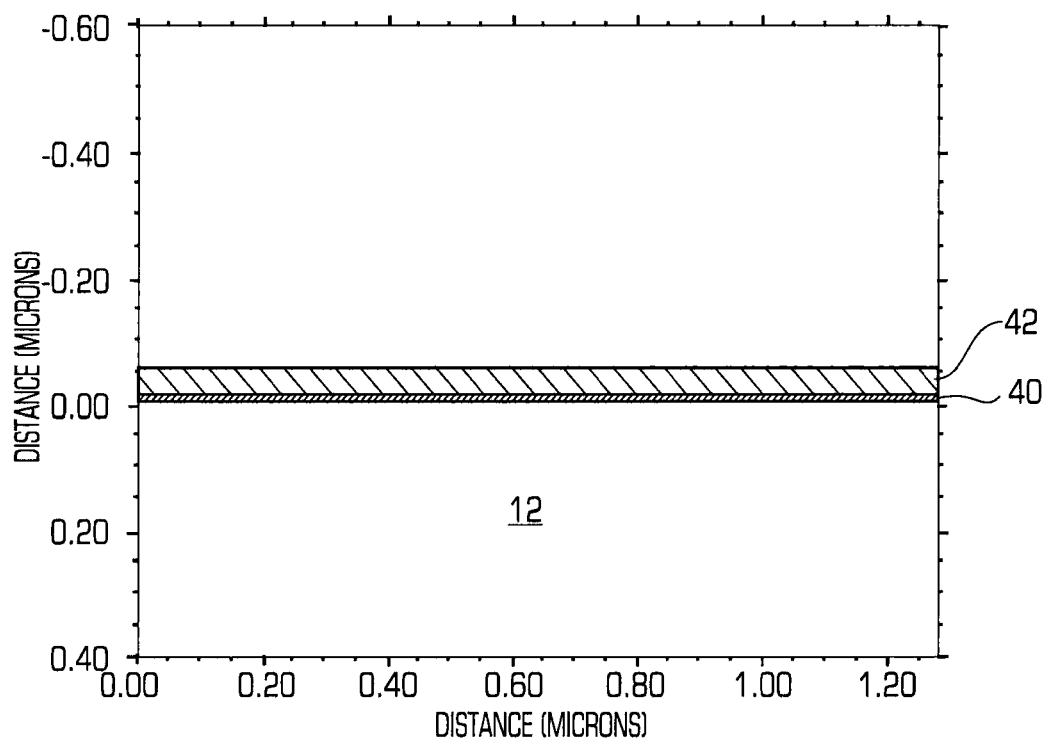
FIGS. 4(A-L) are cross sectional views of another process to make another embodiment of the memory cell of the present invention.
Figure 4B:
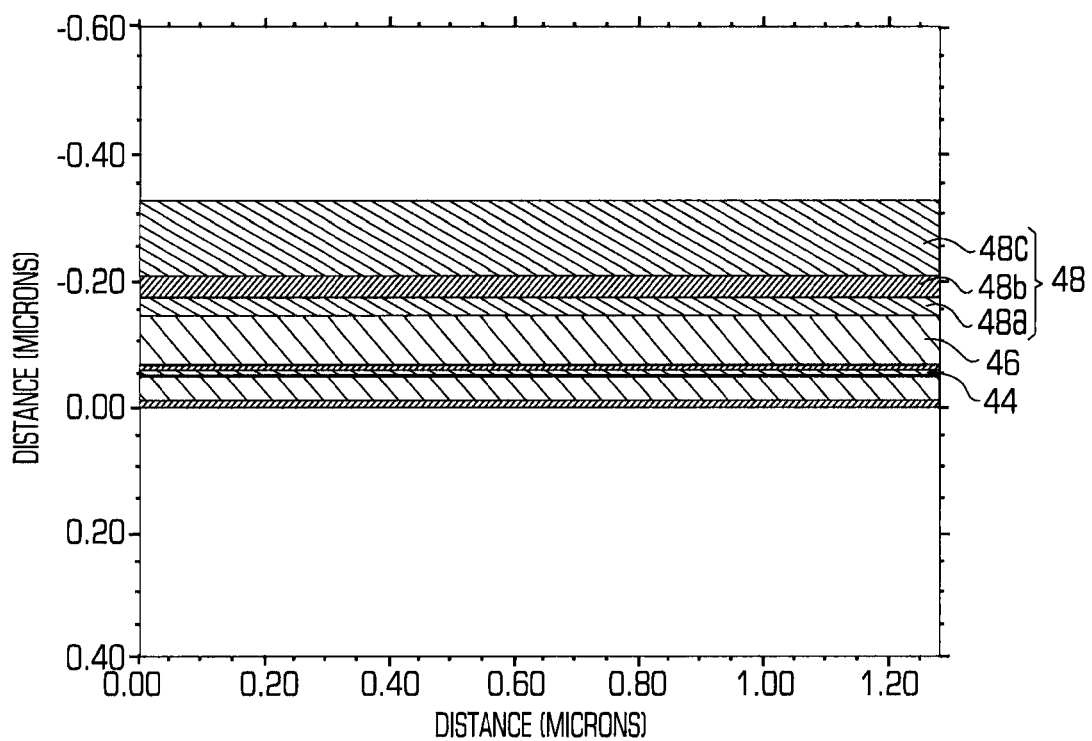

Referring to FIG. 4B there is shown a cross sectional view of the next steps in the process of making the cell 10 option B of the present invention. Another insulating layer 44, such as silicon dioxide (or even a composite layer, such as ONO) is deposited or formed on the first layer 42 of polysilicon. Depending on whether the material is silicon dioxide or ONO, the layer 44 can be on the order of 100-200 angstroms. A second layer 46 of polysilicon is then deposited or formed on the layer 44. The second layer 46 of polysilicon is on the order of 500-4000 angstroms thick. Another layer 48 of insulator is deposited or formed on the second layer 46 of polysilicon and used as a hard mask during subsequent dry etching. In the preferred embodiment, the layer 48 is a composite layer, comprising silicon nitride 48*a*, silicon dioxide 48*b*, and silicon nitride 48*c*. In the preferred embodiment for the 90 nm process, the dimensions are 200-600 angstroms for layer 48*a*, 200-600 angstroms for layer 48*b*, and 500-3000 angstroms for layer 48*c*.

Figure 4C:
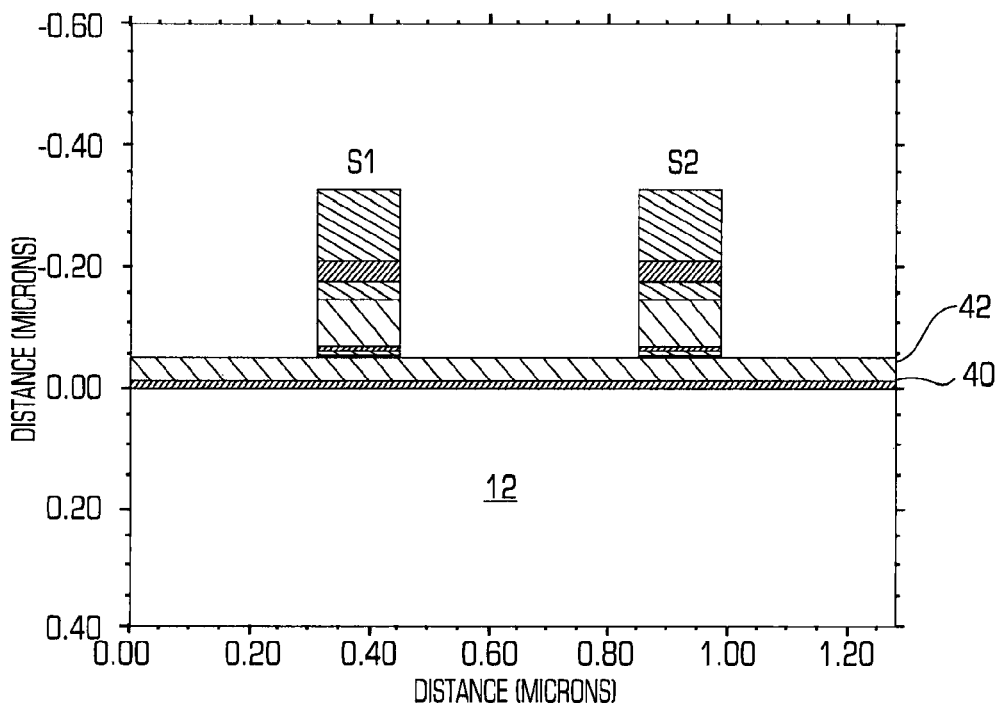

Referring to FIG. 4C there is shown a cross sectional view of the next step in the process of making the cell 10 option B of the present invention. Photoresist material (not shown) is deposited on the structure shown in FIG. 4B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 4C. Although only two "stacks": S1 and S2 are shown, it should be clear that there are number of such "stacks" that are separated from one another.

Figure 4D:
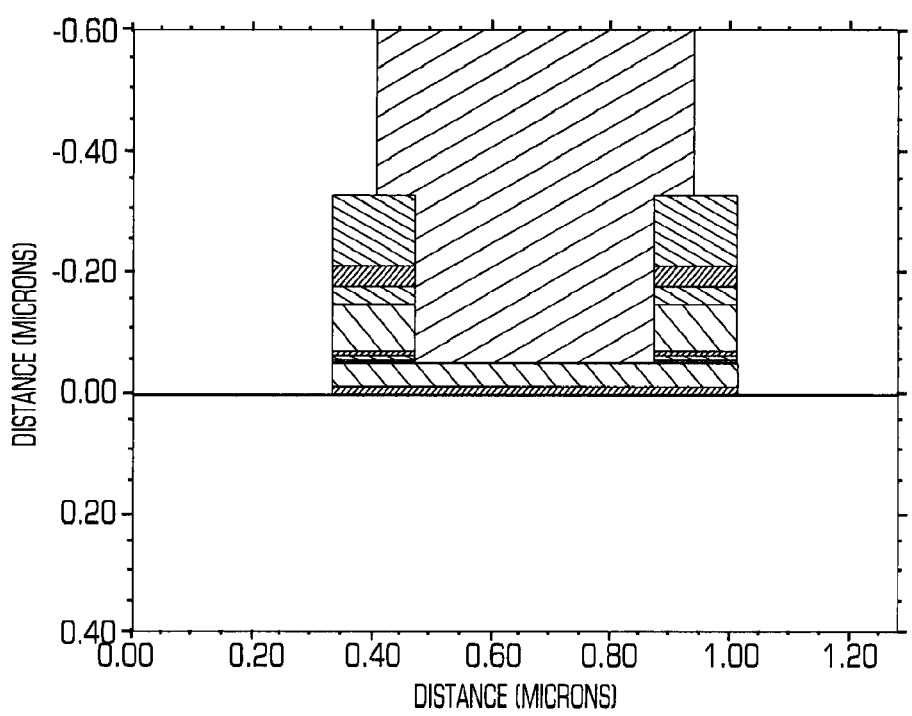

Referring to FIG. 4D there is shown a cross sectional view of the next steps in the process of making the cell 10 option B of the present invention. A photoresist mask is formed over the regions between the stacks S1 and S2, and other alternating pairs stacks. For the purpose of this discussion, this region between the stacks S1 and S2 will be called the "inner region" and the regions not covered by the photoresist, shall be referred to as the "outer regions". The exposed first polysilicon 42 in the outer regions is anisotropically etched. The oxide layer 40 is similarly anisotropically etched. The resultant structure is shown in FIG. 4D.

Figure 4E:
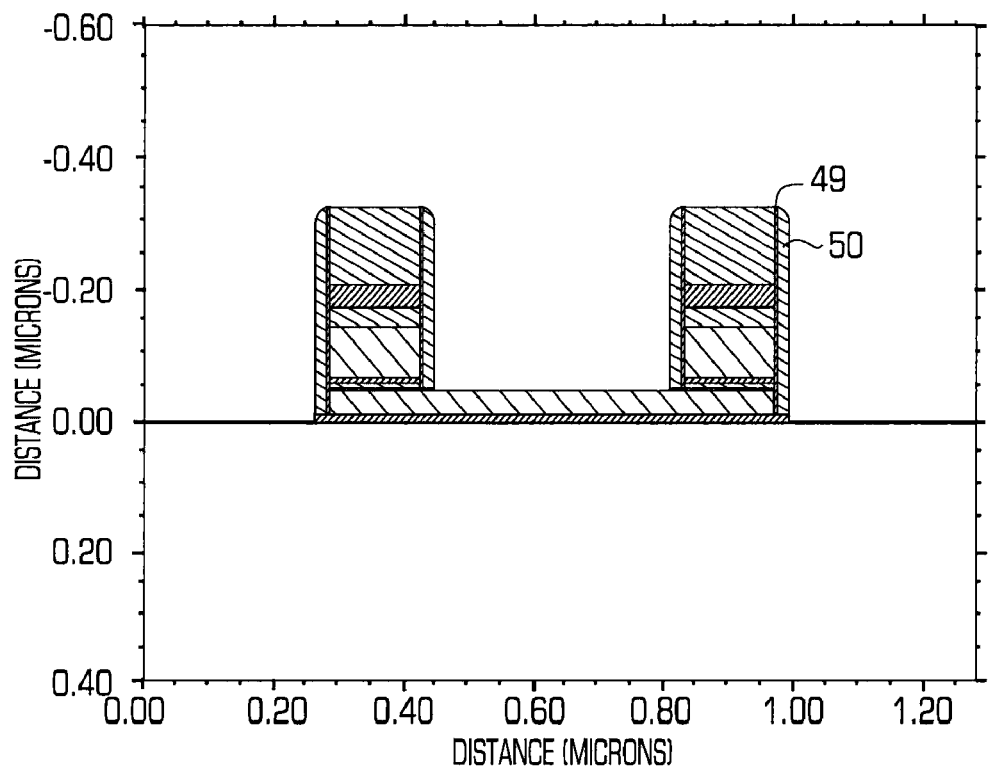

Referring to FIG. 4E there is shown a cross sectional view of the next steps in the process of making the cell 10 option B of the present invention. Silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2 (and all the other spaced apart stacks which are not shown). The resultant structure is shown in FIG. 4E.

Figure 4F:
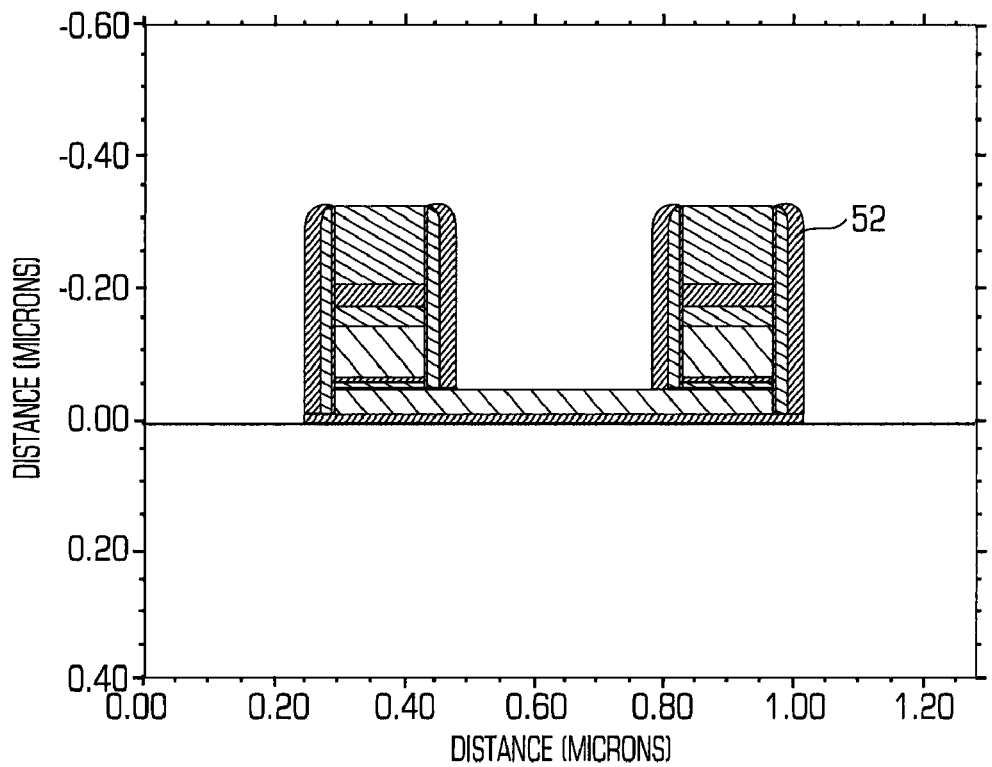

Referring to FIG. 4F there is shown a cross sectional view of the next steps in the process of making the cell 10 option B of the present invention. A layer of oxide 52 is then deposited or formed. The oxide layer 52 is then subject to an anisotropical etch leaving spacers 52, adjacent to the stacks S1 and S2. The resultant structure is shown in FIG. 4F.

Figure 4G:
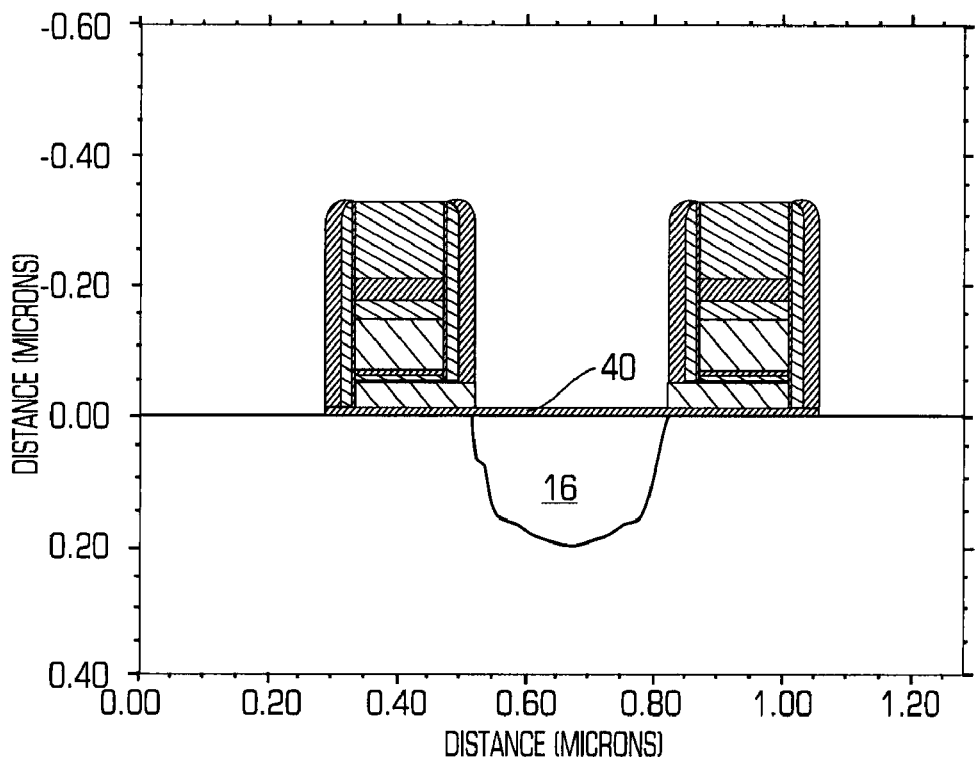

Referring to FIG. 4G there is shown a cross sectional view of the next steps in the process of making the cell 10 option B of the present invention. Photoresist material is then deposited and is masked leaving openings in the inner regions between the stacks S1 and S2. Again, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may also be anisotropically etched. The resultant structure is subject to a high voltage ion implant forming the second regions 16. The resultant structure is shown in FIG. 4G.

Figure 4H:
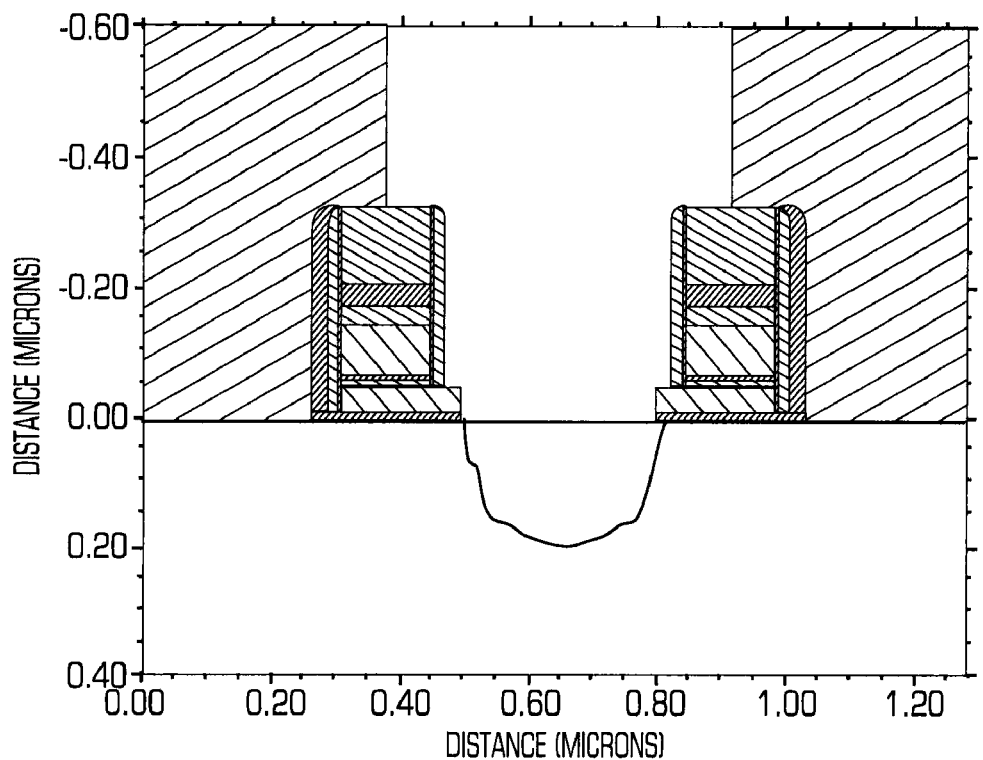

Referring to FIG. 4H there is shown a cross sectional view of the next steps in the process of making the cell 10 option B of the present invention. The oxide spacer 52 adjacent to the stacks S1 and S2 in the inner region is removed by e.g. a wet etch or a dry isotropic etch. The resultant structure is shown in FIG. 4H.

Figure 4I:
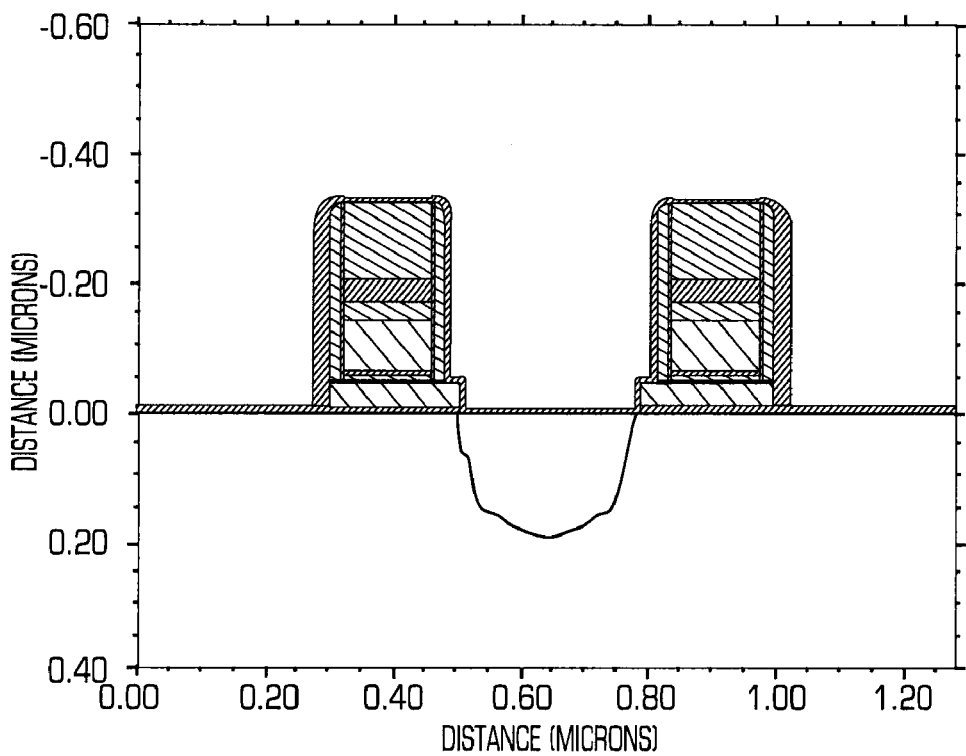

Referring to FIG. 4I there is shown a cross sectional view of the next steps in the process of making the cell 10 option B of the present invention. The photoresist material in the outer regions of the stacks S1 and S2 is removed. Silicon dioxide 54 is deposited or formed everywhere. The resultant structure is shown in FIG. 4I.

Figure 4J:
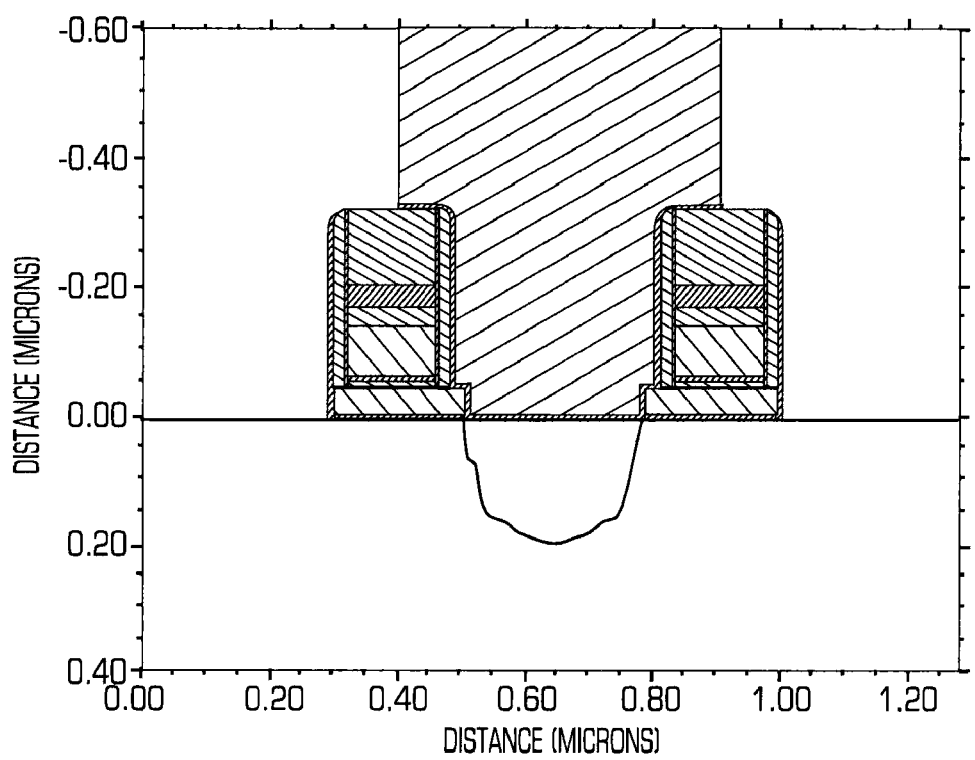

Referring to FIG. 4J there is shown a cross sectional view of the next steps in the process of making the cell 10 option B of the present invention. The structure is once again covered by photoresist material and a masking step is performed exposing the outer regions of the stacks S1 and S2 and leaving photoresist material covering the inner region between the stacks S1 and S2. An oxide anisotropical etch is performed, to reduce the thickness of the oxide spacer 54 in the outer regions of the stack S1 and S2, and to completely remove silicon dioxide from the exposed silicon substrate 12 in the outer regions. The resultant structure is shown in FIG. 4J.

Figure 4K:
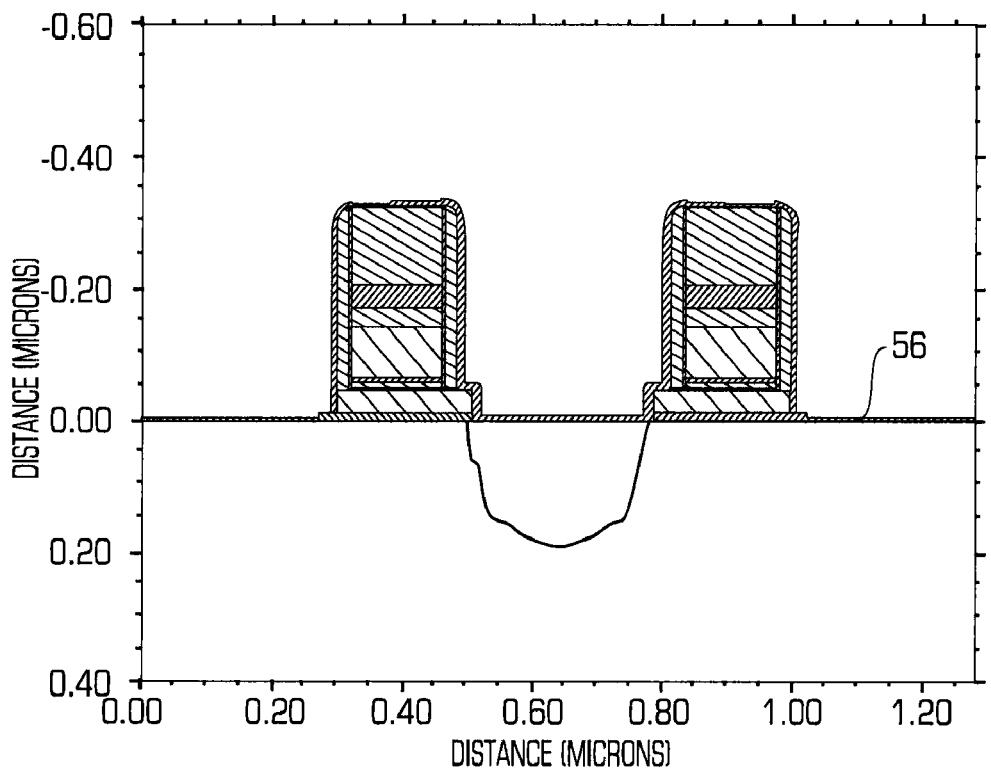

Referring to FIG. 4K there is shown a cross sectional view of the next steps in the process of making the cell 10 option B of the present invention. A thin layer 56 of silicon dioxide, on the order of 20-100 angstroms, is formed on the structure. This oxide layer 56 is the gate oxide between the select gate and the substrate 12. the resultant structure is shown in FIG. 4J.

Figure 4L:
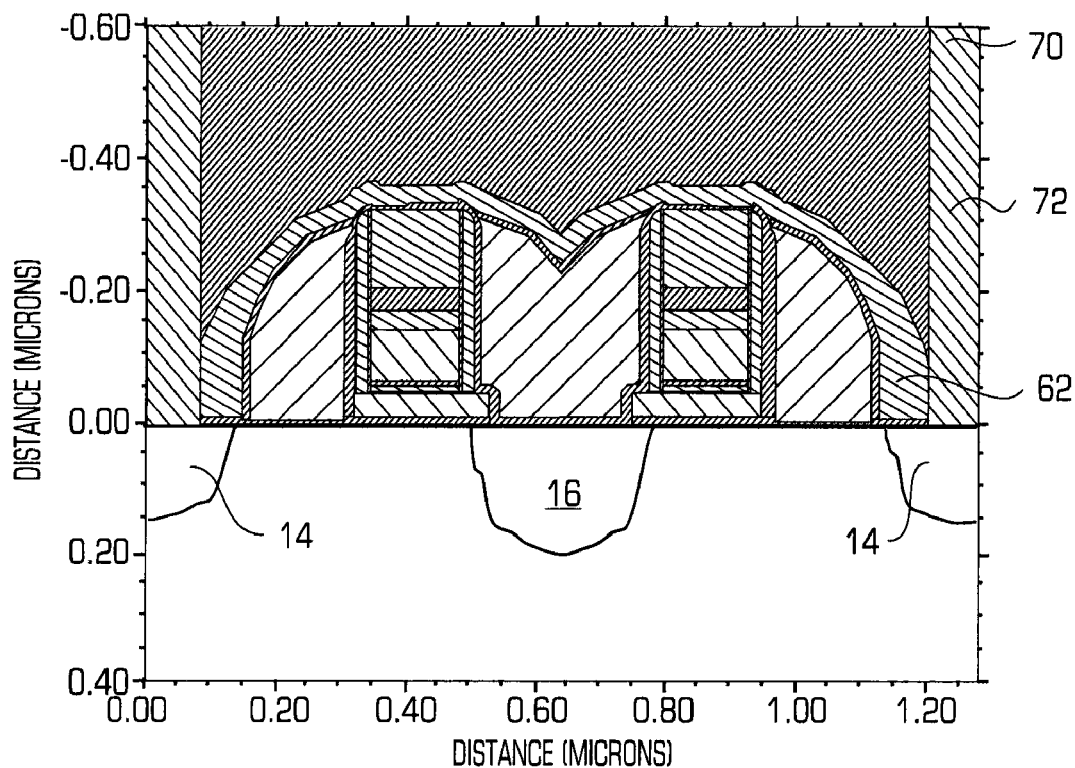

Referring to FIG. 4L there is shown a cross sectional view of the next steps in the process of making the cell 10 option B of the present invention. Polysilicon 60 is deposited everywhere. The layer 60 of polysilicon is then subject to an anisotropical etch forming spacers in the outer regions of the stack S1 and S2 which form the select gates 20 of two memory cells 10 adjacent to one another sharing a common second region 16. In addition, the spacers within the inner regions of the stacks S1 and S2 are merged together forming a single erase gate 24 which is shared by the two adjacent memory cells 10. A layer of insulator 62 is deposited on the structure, and etched anisotropically to form spacers 62 next to the select gates 20. In the preferred embodiment, insulator 62 is a composite layer comprising silicon dioxide and silicon nitride. Thereafter, an ion implant step is performed forming the first regions 14. Each of these memory cells on another side share a common first region 14. Insulators and metallization layers are subsequently deposited and patterned to form bit line 70 and bit line contacts 72.

The operations of program, read and erase and in particular the voltages to be applied may be the same as those as set forth in U.S. Pat. No. 6,747,310, whose disclosure is incorporated herein by reference in its entirety.

However, the operating conditions may also be different. For example, for erase operation, the following voltages may be applied.

| WL (20) | | BL (70) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 0 v | 0 v | 0 v | 0 v | 0 v | 0 v | 0 v or −6 to −9 v | 0 v | 9-11 v or 7-9 v | 0 v |

During erase, a negative voltage on the order of −6 to −9 volts may be applied to the select control gate 26. In that event, the voltage applied to the select erase gate 24 may be lowered to approximately 7-9 volts. The "overhang" of the erase gate 24 shields the tunneling barrier from the negative voltage applied to the select control gate 26.

For programming, the following voltages may be applied.

| WL (20) | | BL (70) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 1-2 v | 0 v | 0.5-5 uA | 1.5-3 v | 3-6 v | 0 v | 6-9 v | 0 v | 6-9 v | 0 v |

During programming, the selected cell is programmed through efficient hot-electron injection with the portion of the channel under the floating gate in inversion. The medium voltage of 3-6 volts is applied to the select SL to generate the hot electrons. The select control gate 26 and erase gate 24 are biased to a high voltage (6-9 volts) to utilize the high coupling ratio and to maximize the voltage coupling to the floating gate. The high voltage coupled to the floating gate induces FG channel inversion and concentrates lateral field in the split area to generate hot electrons more effectively. In addition, the voltages provide a high vertical field to attract hot electron into the floating gate and reduce injection energy barrier.

For reading, the following voltages may be applied.

| WL (20) | | BL (70) | | SL (16) | | CG (26) | | EG (24) | |
|---|---|---|---|---|---|---|---|---|---|
| Select | Unselect | Select | Unselect | Select | Unselect | Select | Unselect | Select | Unselect |
| 1.5-3.7 v | 0 v | 0.5-1.5 v | 0 v | 0 v | 0 v | 0 v-3.7 V | 0 v | 0 v-3.7 V | 0 v |

During read, depending upon the balance between program and read operations, the voltages on the select control gate 26 and the select erase gate 24 can be balanced because each is coupled to the floating gate. Thus, the voltages applied to each of the select control gate 26 and select erase gate 24 can be a combination of voltages ranging from 0 to 3.7V to achieve optimum window. In addition, because voltage on the select control gate is unfavorable due to the RC coupling, voltages on the select erase gate 24 can result in a faster read operation.

What is claimed is:

1. A method of increasing the erase efficiency of a non-volatile memory cell of the type having a substrate of a substantially single crystalline material of a first conductivity type, with a first region of a second conductivity type, and a second region of the second conductivity type, spaced apart from the first region, forming a channel region therebetween; said memory cell having a select gate insulated and spaced apart from a first portion of the channel region adjacent to the first region; and having a floating gate insulated and spaced apart from a second portion of the channel region; the floating gate having a first end closest to the select gate and a second end furthest away from the select gate; said floating gate having a top surface and a bottom surface opposite thereto, with said bottom surface facing the channel region, and a tip on the top surface at the second end, with a tunneling barrier covering said tip; said memory cell having a control gate with a top surface and a bottom surface opposite thereto, with said bottom surface insulated from and facing the top surface of the floating gate; said control gate insulated and adjacent to the selected gate, said control gate having a first end closest to the select gate and a second end furthest away from the select gate; wherein said second end of the control gate is closer to a vertical line aligned with the first end of the floating gate than the second end of the floating gate, whereby a portion of the top surface of the floating gate is not facing the bottom surface of the control gate; said memory cell further having an erase gate having a first portion insulated and spaced apart from the second region of the substrate and having a first end separated from the second end of the floating gate, and a second portion electrically connected to the first portion and having a first end; wherein said method comprising:

shielding the tunneling barrier from the control gate by positioning said second portion of the erase gate above the tip of the floating gate and insulated therefrom by said tunneling barrier with said first end adjacent to the control gate, said second portion of the erase gate separated from the floating gate by a first length measured in a direction substantially perpendicular to the direction from the first region to the second region; with said first end of said second portion closest to the second end of the control gate, said second portion of the erase gate having a second length measured from the first end of the second portion of the erase gate to a vertical line aligned with the first end of the first portion of the erase gate in a direction substantially parallel to the direction from the first region to the seconds region; and wherein said ratio of the second length to the first length is between approximately 1.0 and 2.5.

2. The method of claim 1 further comprising:

applying a negative voltage to the control gate, during an erase operation.

* * * * *